(12) United States Patent
Lin et al.

(10) Patent No.: US 12,550,740 B2
(45) Date of Patent: Feb. 10, 2026

(54) CHIP PACKAGING STRUCTURE AND METHOD FOR MANUFACTURING SAME

(71) Applicant: SJ Semiconductor(Jiangyin) Corporation, Jiangyin (CN)

(72) Inventors: Chengchung Lin, Jiangyin (CN); Jin Yang, Jiangyin (CN)

(73) Assignee: SJ Semiconductor(Jiangyin) Corporation, JiangSu (CN)

( * ) Notice: Subject to any disclaimer, the term of this patent is extended or adjusted under 35 U.S.C. 154(b) by 387 days.

(21) Appl. No.: 18/132,560

(22) Filed: Apr. 10, 2023

(65) Prior Publication Data

US 2023/0335507 A1     Oct. 19, 2023

(30) Foreign Application Priority Data

Apr. 15, 2022   (CN) .......................... 202210396511.4

(51) Int. Cl.
*H01L 23/00*      (2006.01)
*H05K 1/02*       (2006.01)

(52) U.S. Cl.
CPC ............ *H01L 23/562* (2013.01); *H01L 24/16* (2013.01); *H01L 24/32* (2013.01); *H01L 24/73* (2013.01); *H05K 1/0271* (2013.01); *H01L 2224/16225* (2013.01); *H01L 2224/32225* (2013.01); *H01L 2224/73204* (2013.01); *H01L 2924/3511* (2013.01)

(58) Field of Classification Search
None
See application file for complete search history.

(56) References Cited

U.S. PATENT DOCUMENTS

| 2009/0152713 A1* | 6/2009 | Sauciuc | H01L 23/3737 |
| | | | 257/E23.101 |
| 2015/0262972 A1* | 9/2015 | Katkar | H01L 25/0657 |
| | | | 438/107 |
| 2017/0125332 A1* | 5/2017 | Song | H01L 24/81 |

* cited by examiner

*Primary Examiner* — Hung K Vu
(74) *Attorney, Agent, or Firm* — IPRTOP LLC

(57) ABSTRACT

A chip packaging structure and a method for manufacturing are disclosed, including a semiconductor chip, a device layer, and a warpage compensation layer, which is bonded to the device layer. The warpage compensation layer has a thermal expansion coefficient matching that of the semiconductor chip, the mismatch in coefficients of thermal expansion between the substrate and the semiconductor chip can be compensated, thereby reducing or eliminating warpage. The thermal expansion coefficient of the warpage compensation layer is also close to that of the semiconductor chip, so they form a structure that has an in-between thermal expansion coefficient, which creates synchronous tensions or stress on top and bottom surfaces of the substrate to prevent it from bending toward one side.

5 Claims, 3 Drawing Sheets

CHIP PACKAGING STRUCTURE AND METHOD FOR MANUFACTURING SAME

CROSS REFERENCE TO RELATED APPLICATION

The present application claims the benefit of priority to Chinese Patent Application No. CN 202210396511.4, entitled "CHIP PACKAGING STRUCTURE AND METHOD FOR MANUFACTURING SAME", filed with CNIPA on Apr. 15, 2022, the disclosure of which is incorporated herein by reference in its entirety for all purposes.

FIELD OF TECHNOLOGY

The present disclosure generally relates to semiconductor packaging technology, and in particular to a chip packaging structure and a method for manufacturing the same.

BACKGROUND

In recent years, integrated circuit packaging technologies have been developing rapidly, and the flip-chip electronic packages have become the mainstream, occupying 60-70% of the entire integrated circuit packaging market. In flip-chip electronic packages, there usually is a large coefficient of thermal expansion (CTE) mismatch between the various materials used for packaging in the same end products. As shown in FIG. 1, the CTE of common package materials, for example, the FR4 PCB substrate 101 is 16-18 ppm/° C., the CTE of the semiconductor chip 301 (usually a silicon wafer) is 2.6-2.8 ppm/° C., and the CTE of the copper cap is 18-19 ppm/° C. During assembly and testing of a flip-chip electronic package as shown in FIG. 1, when a semiconductor chip 301 is attached to a substrate 101 through a mass reflow process or a thermal compression bonding process, the flip-chip electronic package will often warp due to the CTE mismatch between the semiconductor chip 301 and the substrate 101, and a device layer 112 bonded to the bottom surface of the substrate 101 will also have solder failures due to the warpage. Also, semiconductor chips are getting thinner and thinner, with some even thinner than 100 um, making package warpage more likely.

To reduce package warpage during assembly, testing, and use, it is critical to design flip-chip packages with warpage-compensation features. In the existing arts, warpage of flip-chip electronic packages is usually controlled by reinforcing ribs, as shown in FIG. 2, where reinforcing ribs 100 (usually made of metal such as stainless steel) are formed around the periphery of the chip 301 on the substrate 101 for reinforcement and to limit warpage. However, the reinforcing ribs 100 take up a large amount of the surface areas of the substrate, which has a negative impact on subsequent processes.

SUMMARY

The present disclosure provides a chip packaging structure, comprising: a substrate, wherein a device layer and a first conductive layer are formed on a bottom surface of the substrate; a warpage compensation layer, bonded to a bottom surface of the device layer, wherein the warpage compensation layer has a coefficient of thermal expansion in a range of 2-8 ppm/° C.; a semiconductor chip, bonded to a top surface of the substrate; and a circuit board provided below the substrate, wherein a second conductive layer is disposed over a top surface of the circuit board and is electrically connected to the first conductive layer, wherein the first conductive layer and the second conductive layer are both patterned, and wherein a pattern of the second conductive layer is arranged to align to a pattern of the first conductive layer.

The present disclosure also provides a method for manufacturing a chip packaging structure, comprising: disposing a device layer and a first conductive layer on a bottom surface of a substrate; bonding a warpage compensation layer to a bottom surface of the device layer, wherein the warpage compensation layer has a coefficient of thermal expansion in a range of 2-8 ppm/° C., bonding a semiconductor chip to a top surface of the substrate; and providing a circuit board below the substrate, wherein a second conductive layer is disposed over a top surface of the circuit board, wherein the first conductive layer is electrically connected to the second conductive layer, and wherein a pattern of the second conductive layer is arranged to align to a pattern of the first conductive layer.

In summary, the present disclosure provides a chip packaging structure and a method for manufacturing the same are provided; from top to bottom, the chip packaging structure includes a semiconductor chip, a substrate, a device layer, and a warpage compensation layer, and by bonding the warpage compensation layer to a bottom of the device layer while the warpage compensation layer has a low coefficient of thermal expansion which matches that of the semiconductor chip, the mismatch in coefficients of thermal expansion between the substrate and the semiconductor chip can be compensated, thereby reducing or eliminating warpage resulted from warpage. Specifically, the coefficient of thermal expansion of the warpage compensation layer is close to that of the semiconductor chip, therefore the warpage compensation layer and the semiconductor chip together form a structure that is symmetrical in terms of coefficients of thermal expansion, and the structure sandwiches the substrate, which creates a synchronous tension or stress on top and bottom surfaces of the substrate to prevent it from bending toward one side, thus reducing or eliminating warpage. The warpage compensation layer is provided below the device layer, and therefore does not take up additional surface areas of the substrate.

REFERENCE NUMERALS

Figure 1:
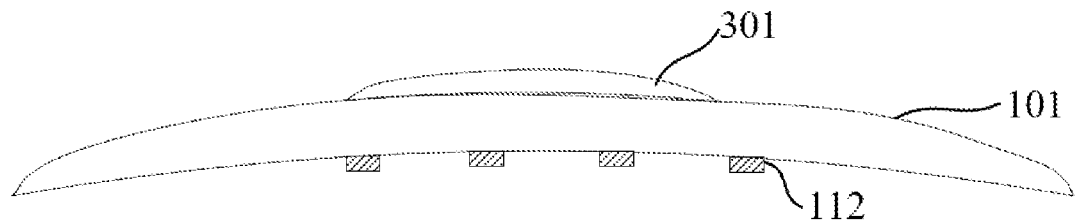
FIG. 1 shows a schematic diagram of warpage in an existing chip package.
Figure 2:
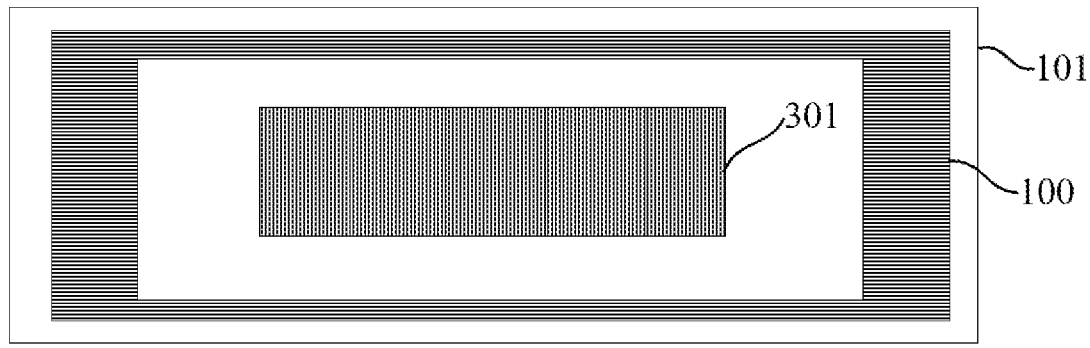
FIG. 2 shows a top view of a structure including reinforcing ribs in another existing chip package.

100 Reinforcing ribs
101 Substrate
111 First conductive layer
112 Device layer
113 Filler adhesive layer
114 First solder ball
201 Warpage compensation layer
301 Semiconductor chip
302 Bonding adhesive layer
303 Conductive plugs
401 Circuit board
411 Second solder ball
412 Second conductive layer

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure.

For example, when the embodiments of the present disclosure are described in detail, for ease of description, the cross-sectional view showing the device structure will not be partially enlarged according to the general scale, and the schematic diagram is only an example, which should not limit the scope of protection. In addition, the actual production should include the length, width and depth of the three-dimensional space dimensions.

For the convenience of description, spatial relation terms such as "below", "under", "beneath", "on", "above", "up", etc. may be used herein to describe the relationships between an element or feature and other elements or features. It will be appreciated that these spatial relationship terms are intended to encompass directions of the device in use or operation other than those depicted in the accompanying drawings. In addition, when a layer is referred to as being "between" two layers, it may be the only layer between the two layers, or there may be one or more layers in-between. Herein, "between" are used to include both endpoints.

In the context of this disclosure, the structure described with a first feature "on top" of a second feature may include embodiments where the first and second features are formed in direct contact, or it may include embodiments where additional features are formed between the first and second features such that the first and second features are not in direct contact.

It should be noted that the drawings provided in this disclosure only illustrate the basic concept of the present invention in a schematic way, so the drawings only show the components related to the present invention. The drawings are not necessarily drawn according to the number, shape and size of the components in actual implementation; during the actual implementation, the type, quantity and proportion of each component can be changed as needed, and the components' layout may also be more complicated.

As shown in FIGS. 3-11, the present disclosure provides a method for manufacturing a chip packaging structure. The method includes operations S1-S4.

Figure 3:
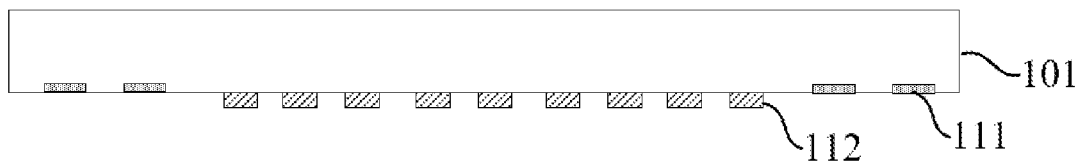
FIG. 3 shows a schematic side view of a substrate according to one embodiment of the present disclosure.

S1: providing a substrate 101, wherein a device layer 112 and a patterned first conductive layer 111 are formed over a bottom surface of the substrate 101, as shown in FIG. 3. In an embodiment, the substrate 101 is an organic polymer substrate.

Figure 4:
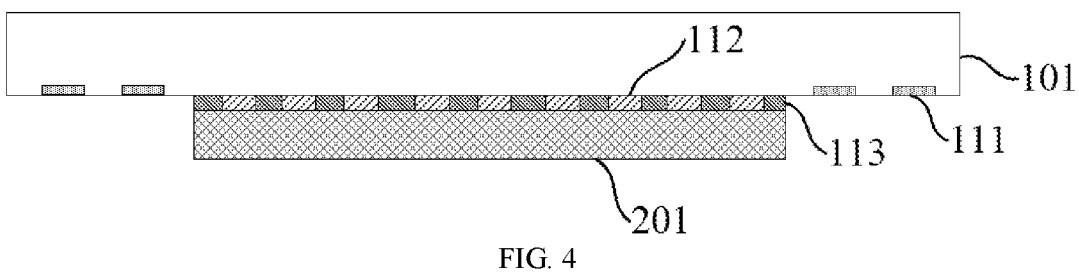
FIG. 4 is a schematic side view showing how a substrate is bonded to a device layer according to one embodiment of the present disclosure.
Figure 5:
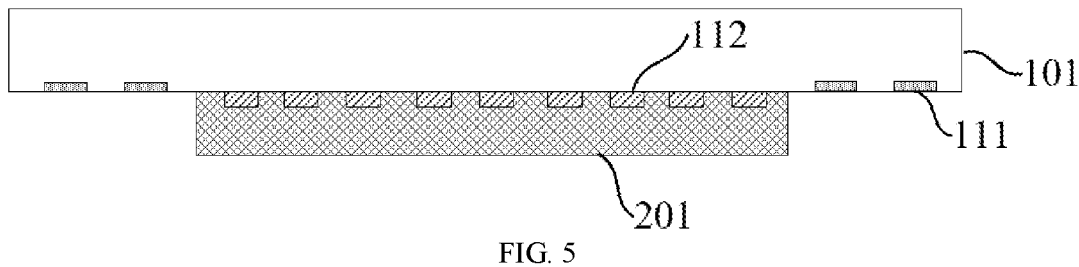
FIG. 5 is a schematic side view showing how a substrate is bonded to a device layer according to one embodiment of the present disclosure.

S2: bonding a warpage compensation layer 201 to the bottom surface of the device layer 112, as shown in FIGS. 4-5, wherein the warpage compensation layer 201 is made of materials with low coefficient of thermal expansion, for example, in the range of 2-8 ppm/° C., in one embodiment, the warpage compensation layer 201 is made of one or more of inorganic materials like glass, ceramic, or some organic materials.

Figure 6:
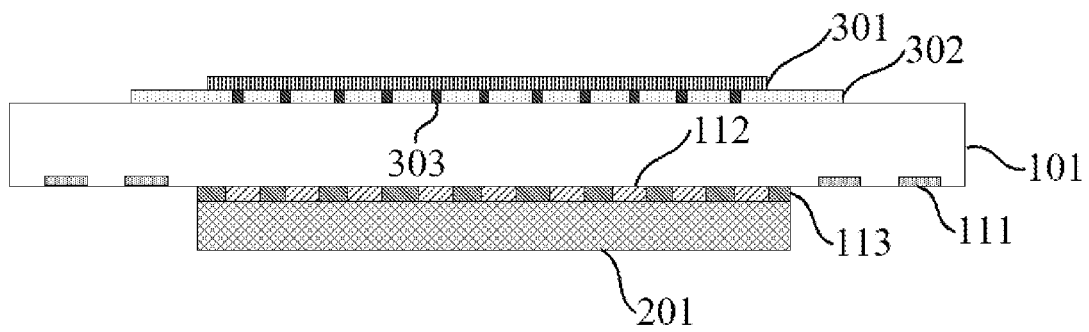
FIG. 6 is a schematic side view showing how a semiconductor chip is bonded to a substrate according to one embodiment of the present disclosure.

S3: bonding a semiconductor chip 301 to a top surface of the substrate 101, as shown in FIG. 6, wherein the semiconductor chip 301 may be a silicon wafer.

Figure 7:
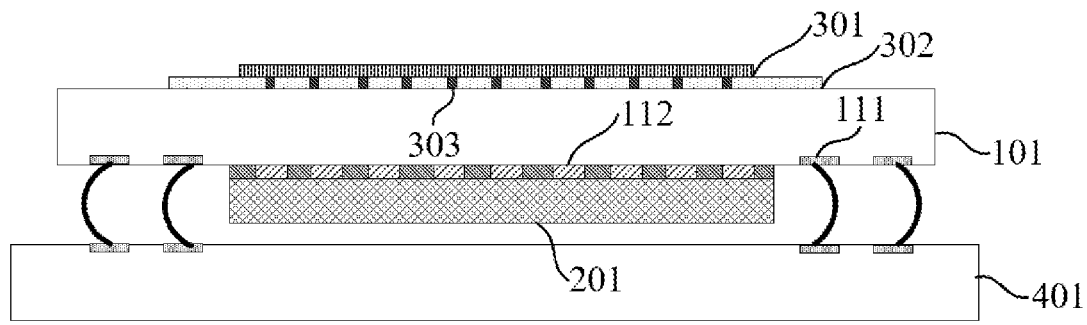
FIG. 7 is a schematic side view showing how a circuit board is electrically connected to a substrate according to one embodiment of the present disclosure.

S4: providing a circuit board 401 below the substrate 101, wherein a patterned second conductive layer 412 is disposed over a top surface of the circuit board 401, the first conductive layer 111 is electrically connected to the second conductive layer 412, and the pattern of the second conductive layer 412 aligns to that of the first conductive layer 111. The circuit board 401 may be a printed circuit board, as shown in FIG. 7.

By bonding the warpage compensation layer 201 (with a low coefficient of thermal expansion) to the bottom surface of the device layer 112, the present disclosure is able to compensate for the mismatch in the coefficient of thermal expansion (CTE) between the substrate 101 and the semiconductor chip 301, thereby eliminating the warpage caused thereby. Specifically, the CTE of the organic polymer substrate 101 is 16-18 ppm/° C. and the CTE of the semiconductor chip 301 is 2.6-2.8 ppm/° C. when the semiconductor chip 301 is a silicon wafer; so by selecting a warpage compensation layer 201 with a CTE close to that of silicon wafers, the warpage compensation layer 201 and the semiconductor chip 301 together form a structure that is symmetrical in terms of CTE, and the structure sandwiches the substrate 101, which creates synchronous tensions or stress on top and bottom surfaces of the substrate to prevent it from bending toward one side, thus reducing or eliminating warpage. In an embodiment, the CTE of the warpage compensation layer 201 is the same as that of the semiconductor chip 301. In addition, the warpage compensation layer 201 is provided below the substrate 101 and although helping with the thermal mismatch, does not directly interfere the top surface of the substrate 101, eliminating the need to form reinforcement ribs on the top surface of the substrate 101 and occupying the chip area at the top surface of the substrate 101. It should be noted that when the warpage compensation layer 201 is made of organic or other inorganic materials, its Young's modulus (i.e., modulus of elasticity) should be greater than 10 Gpa to ensure that it has a certain degree of rigidity. Usually, the Young's modulus of glass is greater than 80 Gpa, and therefore when the warpage compensation layer 201 is made of glass, it always satisfies the above rigidity requirement.

Specifically, the device layer 112 includes one or more of resistors, capacitors, and inductors, wherein the device layer 112 is electrically connected to the semiconductor chip 301 through a conductive channel in the substrate 101. The semiconductor chip 301 may be bonded to the substrate 101 by a mass reflow process or a thermos-compression bonding process.

Further, before bonding the warp compensating layer 201 to the device layer 112 in operation S2, gaps in the device layer 112 should be filled with some material. As an example, referring to FIG. 4, a filler adhesive layer 113 can fill in the gaps between devices in the device layer 112, in this filling process, the bottom surface of the device layer 112 is made flush with the bottom surface of the filler adhesive layer 113, after which the warpage compensation layer 201 is bonded to the bottom surfaces of the device layer 112 and the filler adhesive layer 113; the process may adopt capillary underfill of organic resin fill or non-flow underfill of organic resin, so that gap filling and surface bonding can be done simultaneously in one operation or as closely in time as possible. As another example, referring to FIG. 5, a top surface of the warpage compensation layer 201 may include soft compressible bumps matching the gaps in the device layer 112, the top surface of the warpage compensation layer 201 is bonded to the device layer 112, the warpage compensation layer 201 partially encapsulates the device layer 112, i.e., covering side surfaces and bottom surfaces of the device layer 112, and as a result, the warpage compensation layer 201 and the device layer 112 are in tight fit.

Figure 8:
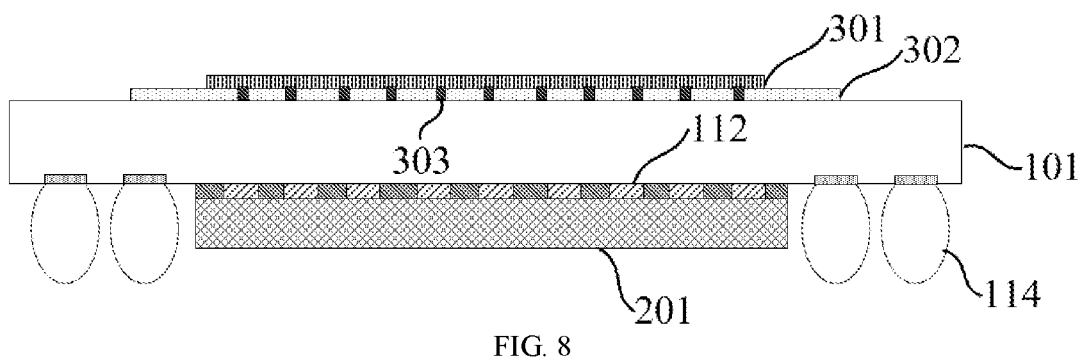
FIGS. 8-11 show schematic diagrams of intermediate structures obtained during a process of connecting a circuit board to a substrate by metal solder balls.
Figure 9:

Further, as shown in FIG. 7, the first conductive layer 111 and the second conductive layer 412 may be electrically connected directly via wires; as shown in FIG. 7, they may also be welded together via metal solder balls. As an example, before operation S4, first solder balls 114 are first connected to the bottom surface of the patterned first conductive layer 111 as shown in FIG. 8; the first solder balls 114 may be made of one or more metal materials of copper, aluminum, nickel, gold, silver, tin, and titanium. In an embodiment, the first solder balls 114 made of silver-tin alloy; and second solder balls 411 are connected to the top surface of the second conductive layer 412, aligned to the first solder balls 114, as shown in FIG. 9. Similar to the first solder balls 114, the second solder balls 411 can also be made of one or more metal materials of copper, aluminum, nickel, gold, silver, tin, and titanium. In an embodiment, the second solder balls 411 are made of silver-tin alloy.

Figure 11:
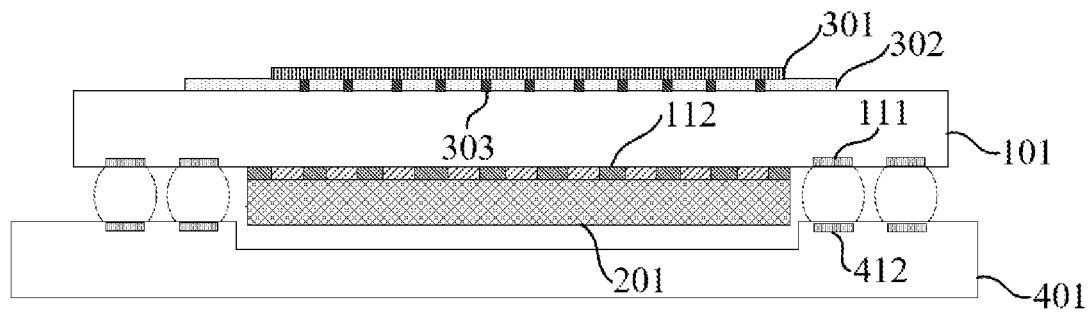

Further, as shown in FIG. 11, a recess matching the shape of the warpage compensation layer 201 may be formed on the top surface of the circuit board 401, to accommodate the warpage compensation layer 201, and/or to provide extra space between the circuit board 401 and the warpage compensation layer 201. When heights of the first solder ball 114 and the second solder ball 411 are relatively low, there is still space between the circuit board 401 and the warp compensation layer 201.

Further, in operation S3, the substrate 101 can be connected to the semiconductor chip 301 by a bonding adhesive layer 302.

Specifically, the filler adhesive layer 113 and the bonding adhesive layer 302 can be made of one or more of polyimide, silicone, and epoxy resin. Conductive plugs 303 are disposed within the bonding adhesive layer 302, and serve as conductive channels; the bonding adhesive layer 302 and the conductive plugs 303 together form an electronic connection array. The conductive plugs 303 can be metal solder balls (such as copper-tin-silver solder balls) or copper pillars, etc.

Figure 10:
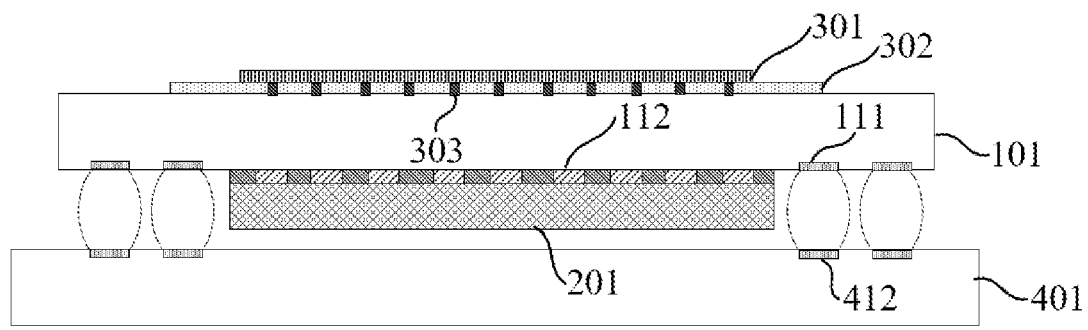

As shown in FIGS. 7, 10, and 11, the present disclosure also provides a chip packaging structure, which may be produced by the method for manufacturing a chip packaging structure as described above.

The packaging structure includes: a substrate 101, wherein a device layer 112 and a first conductive layer 111 are formed over the bottom surface of the substrate 101, and the substrate 101 is, for example, an organic polymer substrate; a warpage compensation layer 201, bonded to the bottom surface of the device layer 112, wherein the warpage compensation layer 201 is made of materials with a coefficient of thermal expansion, lower than that of the substrate, for example, in a range of 2-8 ppm/° C., and the warpage compensation layer 201 is, for example, made of one or more of inorganic materials like glass, ceramic, or organic materials; a semiconductor chip 301, bonded to the top surface of the substrate 101, wherein the semiconductor chip 301 may be a silicon wafer; and a circuit board 401 provided below the substrate 101, wherein the second conductive layer 412 is disposed over the top surface of the circuit board 401 and is electrically connected to the first conductive layer 111, and the pattern of the second conductive layer 412 is aligned to that of the first conductive layer 111. The circuit board 401 may be a printed circuit board.

Specifically, the device layer 112 includes one or more of resistors, capacitors, and inductors, wherein the device layer 112 is electrically connected to the semiconductor chip 301 through a conductive channel in the substrate 101.

By bonding the warpage compensation layer 201 (with a low coefficient of thermal expansion) to the bottom surface of the device layer 112, the present disclosure is able to compensate for the mismatch in the coefficient of thermal expansion between the substrate 101 and the semiconductor chip 301, thereby eliminating the warpage caused thereby. Specifically, the CTE of the organic polymer substrate 101 is 16-18 ppm/° C. and the CTE of the semiconductor chip 301 is 2.6-2.8 ppm/° C. when the semiconductor chip 301 is a silicon wafer; so by selecting a warpage compensation layer 201 with a CTE close to that of silicon wafers, the warpage compensation layer 201 and the semiconductor chip 301 together form a structure that is symmetrical in terms of CTE, and the structure sandwiches the substrate 101, which creates synchronous tensions or stress on top and bottom surfaces of the substrate to prevent it from bending toward one side, thus reducing or eliminating warpage. In an embodiment, the CTE of the warpage compensation layer 201 is the same as that of the semiconductor chip 301. In addition, the warpage compensation layer 201 is provided below the substrate 101 and does not directly interfere with the top surface of the substrate 101, eliminating the need to form reinforcement ribs on the top surface of the substrate 101 and occupy surface areas of the substrate 101. It should be noted that when the warpage compensation layer 201 is made of organic or inorganic materials, its Young's modulus (i.e., modulus of elasticity) should be greater than 10 Gpa to ensure that it has a certain degree of rigidity. Usually, the Young's modulus of glass is greater than 80 Gpa, and therefore when the warpage compensation layer 201 is made of glass, it always satisfies the above rigidity requirement.

Further, before bonding the warp compensating layer 201 to the device layer 112, gaps in the device layer 112 should be filled. As an example, referring to FIG. 4, a filler adhesive layer 113 can be formed in the gaps between devices in the device layer 112, with the bottom surface of the device layer 112 flush with a bottom surface of the filler adhesive layer 113, after which the warpage compensation layer 201 is bonded to the bottom surfaces of the device layer 112 and the filler adhesive layer 113; the process may adopt capillary underfill of organic resin or non-flow underfill of organic resin, so that gap filling and surface bonding can be done simultaneously in one operation; As another example, referring to FIG. 5, a top surface of the warpage compensation layer 201 may include bumps filling the gaps in the device layer 112, the top surface of the warpage compensation layer 201 is bonded to the device layer 112, the warpage compensation layer 201 partially encapsulates the device layer 112, i.e., covering side surfaces and bottom surfaces of the device layer 112, and as a result, the warpage compensation layer 201 and the device layer 112 are in tight fit.

Further, as shown in FIG. 7, the first conductive layer 111 and the second conductive layer 412 may be electrically connected directly by wires; or they may be welded together by metal solder balls, as shown in FIG. 10. As an example, first solder balls 114 are first connected to a bottom surface of the first conductive layer 111 as shown in FIG. 8; the first solder balls 114 may be made of one or more of copper, aluminum, nickel, gold, silver, tin, and titanium. In an embodiment, the first solder balls 114 are made of silver-tin alloy; and second solder balls 411 are connected to the top surface of the second conductive layer 412, aligned to the first solder balls 114, as shown in FIG. 411. Similar to the first solder balls 114, the second solder balls 411 can also be made of one or more of copper, aluminum, nickel, gold, silver, tin, and titanium. In an embodiment, the second solder balls 411 is made of silver-tin alloy.

Further, as shown in FIG. 11, a recess matching the shape of the warpage compensation layer 201 may be formed on the top surface of the circuit board 401, to accommodate the warpage compensation layer 201, and/or to provide extra space between the circuit board 401 and the warpage compensation layer 201. When heights of the first solder balls 114 and the second solder balls 411 are relatively low, there is still space between the circuit board 401 and the warp compensation layer 201.

Further, the substrate 101 is connected to the semiconductor chip 301 by a bonding adhesive layer 302.

Specifically, the filler adhesive layer 113 and the bonding adhesive layer 302 can be made of one or more of polyimide, silicone, and epoxy resin. Conductive plugs 303 are disposed within the bonding adhesive layer 302, and serve as conductive channels; the bonding adhesive layer 302 and the conductive plugs 303 together form an electronic connection array. The conductive plugs 303 can be metal solder balls (such as copper-tin-silver solder balls) or copper pillars, etc.

In summary, the present disclosure provides a chip packaging structure and a method for manufacturing the same are provided; from top to bottom, the chip packaging structure includes a semiconductor chip, a substrate, a device layer, and a warpage compensation layer, and by bonding the warpage compensation layer to a bottom of the device layer while the warpage compensation layer has a relatively low coefficient of thermal expansion matching that of the semiconductor chip, the mismatch in coefficients of thermal expansion between the substrate and the semiconductor chip can be compensated, thereby reducing or eliminating warpage resulted from warpage. Specifically, the coefficient of thermal expansion of the warpage compensation layer is close to that of the semiconductor chip, therefore the warpage compensation layer and the semiconductor chip together form a structure that is symmetrical in terms of coefficients of thermal expansion, and the structure sandwiches the substrate, which creates a synchronous tension or stress on top and bottom surfaces of the substrate to prevent it from bending toward one side, thus reducing or eliminating warpage. The warpage compensation layer is provided below the device layer, and therefore does not take up additional surface areas of the substrate.

The above examples are only illustrative of the principle of the invention and its effectiveness, and are not intended to limit the invention. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A method for manufacturing a chip packaging structure, comprising:
    disposing a device layer and a first conductive layer on a bottom surface of a substrate;
    bonding a warpage compensation layer to a bottom surface of the device layer, wherein the warpage compensation layer has a coefficient of thermal expansion in a range of 2-8 ppm/° C.;
    bonding a semiconductor chip to a top surface of the substrate; and
    providing a circuit board below the substrate, wherein a second conductive layer is disposed over a top surface of the circuit board, wherein the first conductive layer is electrically connected to the second conductive layer, and wherein a pattern of the second conductive layer is arranged to align to a pattern of the first conductive layer.

2. The method according to claim 1, wherein the substrate is an organic polymer substrate with a coefficient of thermal expansion in a range of 16-18 ppm/° C. wherein the semiconductor chip is a silicon wafer with a coefficient of thermal expansion in a range of 2.6-2.8 ppm/° C., and wherein the warpage compensation layer is made of inorganic materials like glass, ceramic, or organic materials.

3. The method according to claim 1, wherein the device layer has gaps between devices where a filler adhesive layer is formed in, wherein the bottom surface of the device layer is flush with a bottom surface of the filler adhesive layer, and wherein the warpage compensation layer is bonded to the bottom surfaces of the device layer and the filler adhesive layer.

4. The method according to claim 1, wherein the device layer has gaps between devices, and wherein a top surface of the warpage compensation layer is arranged to have bumps matching the gaps between devices, so that the warpage compensation layer partially encapsulates the device layer.

5. The method according to claim 1, wherein the first conductive layer is electrically connected to the second conductive layer by wires or by metal solder balls.

* * * * *